United States Patent
Roig-Guitart et al.

(10) Patent No.: US 11,817,478 B2
(45) Date of Patent: Nov. 14, 2023

(54) TERMINATION STRUCTURES WITH REDUCED DYNAMIC OUTPUT CAPACITANCE LOSS

(71) Applicant: SEMICONDUCTOR COMPONENTS INDUSTRIES, LLC, Phoenix, AZ (US)

(72) Inventors: Jaume Roig-Guitart, Oudenaarde (BE); Fredrik Allerstam, Solna (SE); Thomas Neyer, Munich (DE); Andrei Konstantinov, Sollentuna (SE); Martin Domeij, Sollentuna (SE); Jangkwon Lim, Nacka (SE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/247,796

(22) Filed: Dec. 23, 2020

(65) Prior Publication Data

US 2022/0199764 A1    Jun. 23, 2022

(51) Int. Cl.
*H01L 29/06* (2006.01)
*H01L 29/16* (2006.01)

(52) U.S. Cl.
CPC ...... *H01L 29/0623* (2013.01); *H01L 29/1608* (2013.01)

(58) Field of Classification Search
CPC ... H01L 29/1608; H01L 29/0619–0623; H01L 29/7811; H01L 29/7823; H01L 21/26513; H01L 29/0692; H01L 29/6606; H01L 29/872; H01L 29/0615; H01L 29/0607; H01L 29/0611; H01L 29/6609; H01L 29/861
See application file for complete search history.

(56) References Cited

U.S. PATENT DOCUMENTS

| | | |
|---|---|---|
| 2003/0224612 A1 | 12/2003 | Merrett et al. |
| 2013/0285071 A1 | 10/2013 | Kameshiro et al. |
| 2016/0005810 A1 | 1/2016 | Mochizuki et al. |

(Continued)

FOREIGN PATENT DOCUMENTS

| | | |
|---|---|---|
| EP | 0400934 A2 | 12/1990 |
| EP | 3742495 A1 | 11/2020 |
| JP | 2003303956 A | 10/2003 |

OTHER PUBLICATIONS

International Search Report and Written Opinion for PCT Application No. PCT/US2021/073024, dated Apr. 7, 2022, 13 pages.

*Primary Examiner* — Cuong B Nguyen
(74) *Attorney, Agent, or Firm* — Brake Hughes Bellermann LLP (57) ABSTRACT

In a general aspect, a semiconductor device can include a substrate of a first conductivity type, an active region disposed in the substrate, and a termination region disposed in the substrate adjacent to the active region. The termination region can include a junction termination extension (JTE) of a second conductivity type, where the second conductivity type is opposite the first conductivity type. The JTE can have a first depletion stopper region disposed in an upper portion of the JTE, a second depletion stopper region disposed in a lower portion of the JTE, and a high carrier mobility region disposed between the first depletion stopper region and the second depletion stopper region.

20 Claims, 7 Drawing Sheets

(56) References Cited

U.S. PATENT DOCUMENTS

| | | | |
|---|---|---|---|
| 2016/0300960 A1* | 10/2016 | Miyake | H01L 29/872 |
| 2017/0154953 A1* | 6/2017 | Wada | H01L 29/12 |
| 2018/0040688 A1 | 2/2018 | Kobayashi et al. | |
| 2020/0357882 A1* | 11/2020 | Shibukawa | H01L 29/6606 |

* cited by examiner

TERMINATION STRUCTURES WITH REDUCED DYNAMIC OUTPUT CAPACITANCE LOSS

TECHNICAL FIELD

This description relates to terminations structure and, more specifically, to termination structures that can be implemented in power semiconductor devices to reduce dynamic output capacitance switching losses.

BACKGROUND

Power semiconductor devices (e.g., devices operating with voltages of 20 volts (V) or greater) can be used in a wide variety of applications, such as consumer electronics, automotive applications, industrial applications, etc. Such power semiconductor devices can include, e.g., power diode, power transistors, such as power metal oxide semiconductor field effect transistors (MOSFETs), insulated gate bipolar transistors (IGBTs), and so forth. In some implementations, such power semiconductor device can be implemented in a silicon carbide substrate, though other semiconductor materials can be used. One application for such power semiconductor devices is in resonant power converters that, in some implementations, are implemented using soft-switching (e.g., switching using a resonant inductive-capacitive (LC) circuit).

In such soft-switching applications, dynamic power losses can occur as a result of charging and/or discharging an output capacitance (Coss) of a power semiconductor device using soft-switching at high frequency (e.g., frequencies of several hundred kilohertz or greater). Such power (switching) losses can be referred to as dynamic output capacitance loss (DynCoss loss). DynCoss loss reduces efficiency (e.g. power conversion efficiency) of an associated circuit. Accordingly, reducing DynCoss loss can provide efficiency improvements in, e.g., resonant (soft-switching) power converters, as well as other circuit applications in which such DynCoss losses occur.

SUMMARY

In a general aspect, a semiconductor device can include a substrate of a first conductivity type, an active region disposed in the substrate, and a termination region disposed in the substrate adjacent to the active region. The termination region can include a junction termination extension (JTE) of a second conductivity type, where the second conductivity type is opposite the first conductivity type. The JTE can have a first depletion stopper region disposed in an upper portion of the JTE, a second depletion stopper region disposed in a lower portion of the JTE, and a high carrier mobility region disposed between the first depletion stopper region and the second depletion stopper region.

In another general aspect, a semiconductor device can include a substrate of a first conductivity type, an active region disposed in the substrate, and a termination region disposed in the substrate adjacent to the active region. The termination region can include a junction termination extension (JTE) of a second conductivity type, where the second conductivity type can be opposite the first conductivity type. The JTE can having a first depletion stopper region extending from a surface of the substrate to a first depth in the substrate. The JTE can also include a high carrier mobility region extending from the first depth in the substrate to a second depth in the substrate, where the second depth is greater than the first depth. The JTE can further include a second depletion stopper region extending from the second depth in the substrate to a third depth in the substrate, where the third depth is greater than the second depth.

In another general aspect, a semiconductor device can include a heavily-doped n-type silicon carbide substrate, and a lightly-doped n-type silicon carbide epitaxial layer disposed on the heavily doped n-type silicon carbide substrate. The semiconductor device can also include an active region disposed in the lightly-doped n-type silicon carbide epitaxial layer. The active region can include at least one of a power diode, or a power n-channel metal-oxide semiconductor field-effect transistor (MOSFET). The semiconductor device can further include a termination region disposed in the lightly-doped n-type silicon carbide epitaxial layer adjacent to the active region. The termination region can include a p-type junction termination extension (JTE). The p-type JTE can have a first depletion stopper region extending from a surface of the substrate to a first depth in the substrate. The p-type JTE can also have a high carrier mobility region extending from the first depth in the substrate to a second depth in the substrate, the second depth being greater than the first depth. The p-type JTE can further have a second depletion stopper region extending from the second depth in the substrate to a third depth in the substrate, the third depth being greater than the second depth.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated in a given view.

DETAILED DESCRIPTION

The present disclosure is directed to termination structures that can be implemented in power semiconductor devices. The approaches described herein, as compared to current approaches, can reduce dynamic output capacitance loss (DynCoss), such as can occur in soft-switching, applications, as described above. For purposes of illustration and discussion, the example termination structures will be described as being implemented in an n-type substrate (e.g., p-type termination structures), though in some implementations, the descried conductivity and associated carrier types can be reversed. Also, the example implementations described herein are generally discussed as being implemented with power semiconductor devices implemented in silicon carbide (SiC) substrates. However, in some implementation, other types of semiconductor substrates can be used (e.g., silicon, gallium nitride, gallium arsenide, gallium, etc.)

In some implementations, using the approaches described herein, improvements (e.g., reductions) in DynCoss losses on the order of 70% or greater can be achieved (e.g., based on experimental and simulation data). For instance, the example termination structures described herein provide increased hole conductance (during dynamic, soft-switching operation) over previous termination structure implementations, which addresses, at least in part, the contribution (e.g., RC charging of Coss through a termination structure resistance), which can account for 60% to 95% of DynCoss loss in some implementations. That is, the approaches described herein can reduce DynCoss over prior approaches, as they provide termination structures with improved (increased) hole conductance during dynamic (soft-switching) operation.

The termination structure implementations described herein can also allow for reduction in overall size of a termination structure for an associated power semiconductor device, e.g., as compared to current approaches. Such reductions in termination structure size can provide additional improvements (reductions) in DynCoss losses as such size reductions can further increase hole conductance (e.g., reduce hole current path resistance) of the termination structure.

Figure 1:
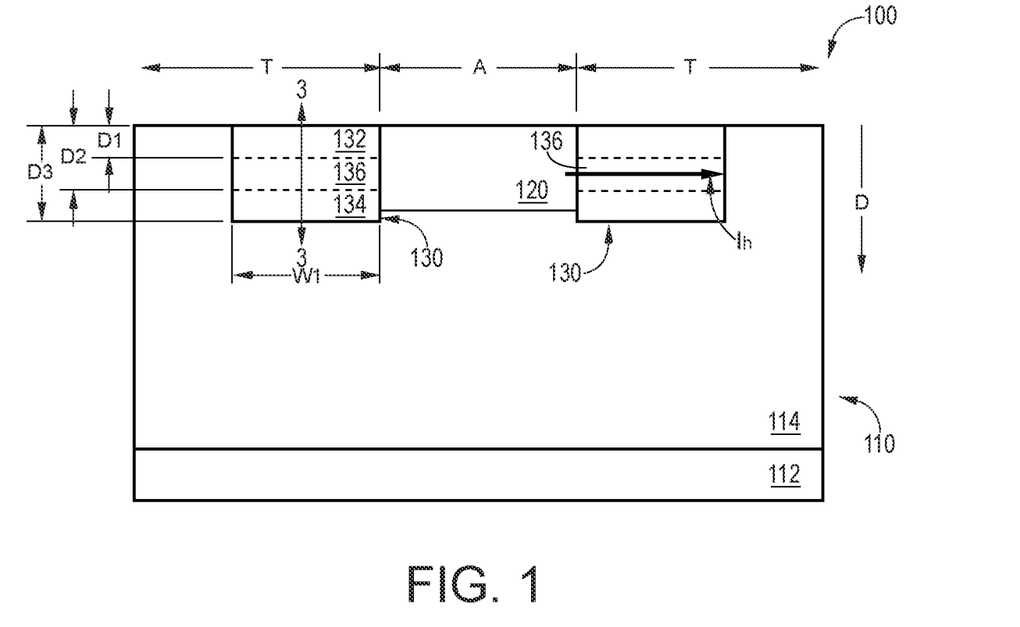
FIG. 1 is a diagram that schematically illustrates a cross-sectional view of a semiconductor device including an active region and a termination region.
Figure 2:
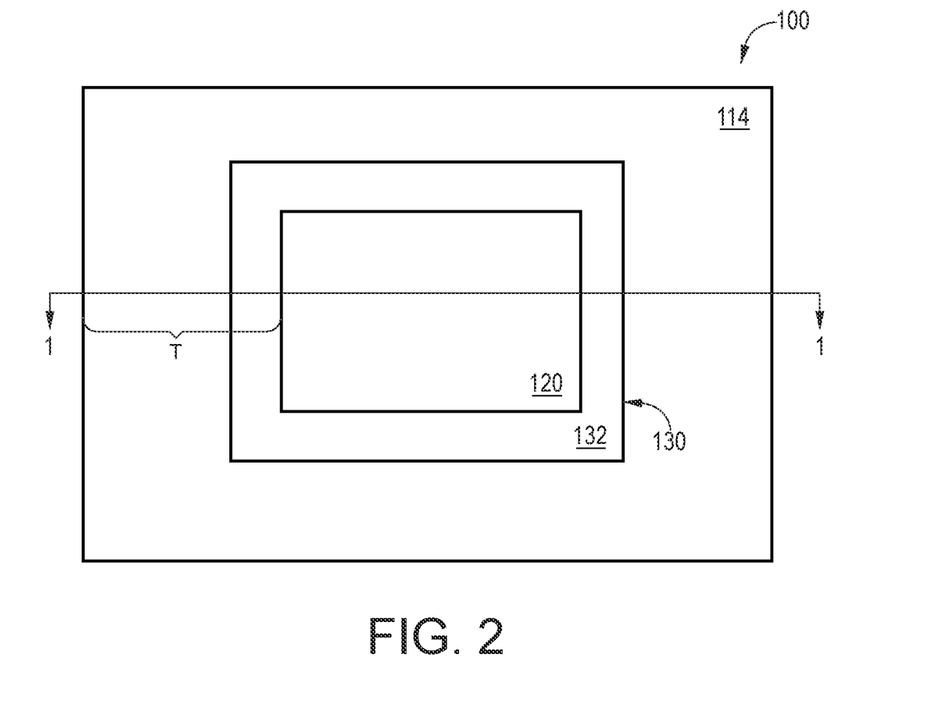
FIG. 2 is a diagram schematically illustrating a plan (top down) view of the semiconductor device of FIG. 1.

FIG. 1 is a diagram that schematically illustrates a cross-sectional view of a semiconductor device 100 including an active region A and a termination region T. FIG. 2 is a diagram that schematically illustrates a plan (top down) view of the semiconductor device 100 of FIG. 1. A section line 1-1 is shown in FIG. 2, which corresponds with the cross-sectional view of the semiconductor device 100 illustrated in FIG. 1. Accordingly, FIGS. 1 and 2 will be described with reference to one another.

As shown in FIG. 1, the semiconductor device 100 is implemented in a semiconductor substrate 110 (e.g. a SiC substrate), which can include a heavily doped (n+) SiC substrate 112 and a lightly doped (n−) SiC epitaxial layer (epitaxial layer 114). In this example, the semiconductor device 100 includes, in the active region A, an active device region 120 that is disposed in the epitaxial layer 114 (e.g., in the semiconductor substrate 110). In some implementations, the active device region 120 can include one or more of a power diode, a power transistor (such as a planar MOSFET, a superjunction FET, a trench FET, an IGBT, etc.), and so forth. In some implementations, the devices included in the active device region 120 can be disposed in a body region (e.g., a p-type body region in this example). The specific device, or devices implemented in the active device region 120 will depend on the particular implementation.

As also shown in FIG. 1, the semiconductor device 100 also includes a termination region T. The termination region T of the semiconductor device 100, in this example, includes a (p-type) junction termination extension (a JTE 130). As shown by FIG. 1, with further reference to FIG. 2, the termination region T (e.g., the JTE 130 and/or a portion of the epitaxial layer 114) can, at least partially surround, or can fully surround the active device region 120, such as surround a perimeter (or portion) of the active device region 120, as shown in FIG. 2. That is, some implementations, the termination region T may not fully surround the active device region 120.

As shown in FIG. 1, the JTE 130 can extend (vertically in FIG. 1), along a line D, from a surface (e.g., an upper surface in FIG. 1) of the epitaxial layer 114, and can include a plurality of regions or layers. For instance, in the semiconductor device 100, the JTE 130 can include a layer 132, a layer 134 and a layer 136. In the examples described herein, the layer 132 can be a first depletion stopper (e.g., heavily p-type doped) layer, and the layer 134 can be a second depletion stopper (e.g., heavily p-type doped) layer. Further in the semiconductor device 100, the layer 136 can be a high carrier (hole) mobility layer, where the layer 136 is, relative to the layer 132 and the layer 134, lightly (p-type) doped. As a result of the lower doping of the layer 136, in this example (e.g., where the semiconductor device 100 is a SiC substrate), an ionization degree of the p-type dopant in the layer 136 can be higher than in the layer 132 or the layer 134. Further, because of the higher ionization degree of p-type dopant in the layer 136, hole mobility in the layer 136 can be higher than in the layer 132, or in the layer 134. Accordingly, hole conductance (e.g., during soft-switching) can be improved (e.g., over previous approaches), and DynCoss loss can, in turn, be reduced.

In the example of FIG. 1, the JTE 130 can have a width W1, the layer 132 can extend from a surface of the epitaxial layer 114 to a depth of D1, the layer 136 can extend from the depth D1 to a depth of D2, and the layer 134 can extend from the depth D2 to a depth of D3. In this example, the depth D3 can be an overall depth of the JTE 130 in the epitaxial layer 114. The dimensions W1, D1, D2 and D3 (as well as dimensions indicated with respect to other implementations described herein) are given by way of example. These dimensions can vary based on the particular implementation, and may not be shown to scale in the illustrated implementations. For instance, in some implementations of the semiconductor device 100, the layer 136 can be thicker than the layer 132 and/or the layer 134. In other words, a difference between D2 and D1 can be greater than D1, and greater than a difference between D3 and D2. In some implementations, the layer 132, the 134 and the layer 134 can each have different thickness, have substantially the same thicknesses, etc.

As shown in FIG. 1, and noted above, the layer 136 can provide (e.g., during resonant, soft-switching of devices included in the active device region 120), a high conductance (e.g., low resistance) conduction path for a hole current $I_h$, which can reduce associated DynCoss loss. In such implementations, $I_h$ is a displacement current, or capacitive current. Also, the direction of $I_h$ can be reversed from that shown in FIG. 1, as well as in FIGS. 4, 7 and 9, e.g., dependent on whether Coss is being charged or discharged. In this example implementation, the layer 132, the layer 134 and the layer 136 can be produced (defined, etc.) using a multi-peaked doping concentration profile, such as the example doping profiles schematically illustrated in FIGS. 3A, 3B and 3C.

In some implementations, the layer 132 can have a first doping concentration (e.g., a first average doping concentration), the layer 134 can have a second doping concentration (e.g., a second average doping concentration), and the layer 136 can have a third doping concentration (e.g., a third average doping concentration), where the first (average) doping concentration and the second (average) doping concentration are an order of magnitude greater, or more, than the third (average) doping concentration.

Figure 3A:
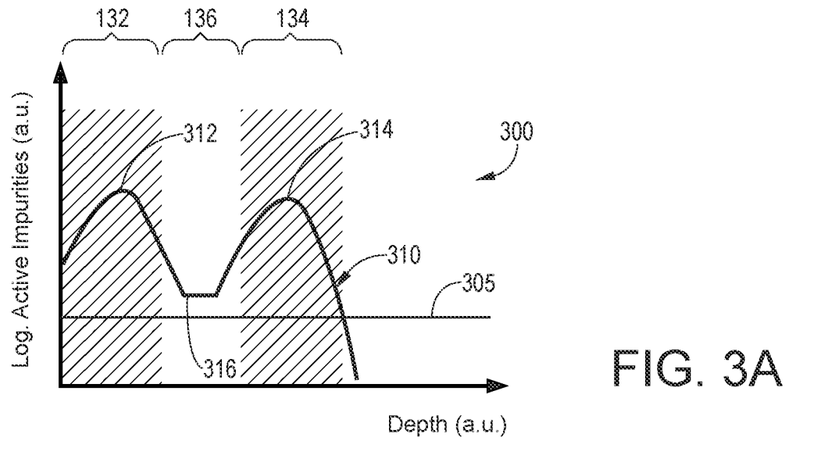
FIGS. 3A-3C are graphs schematically illustrating example active impurity distributions for junction termination extension (JTE) structures of respective implementations of the semiconductor device of FIGS. 1 and 2.
Figure 3B:
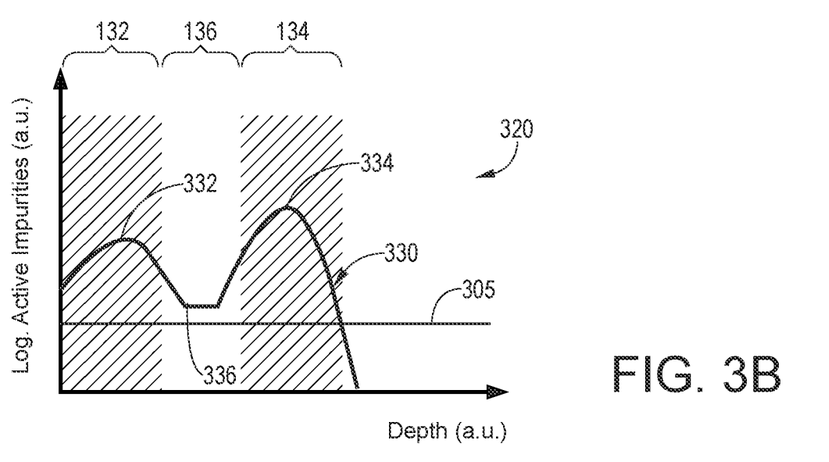
Figure 3C:
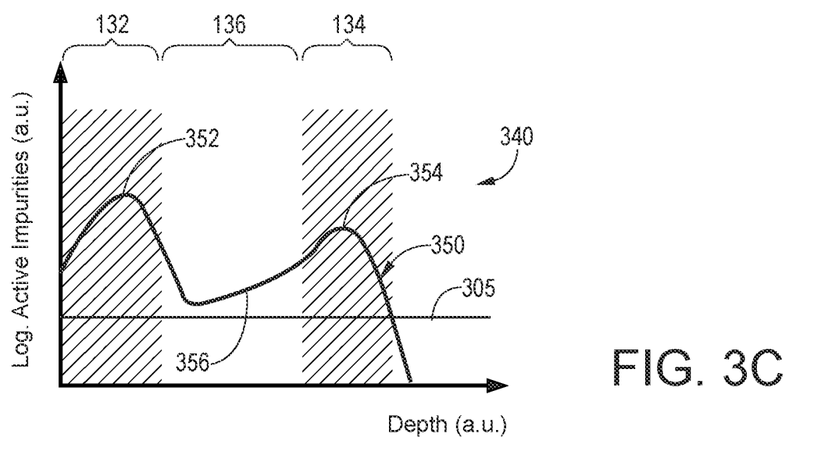

FIGS. 3A-3C are graphs schematically illustrating example active p-type impurity distributions for junction termination extension (JTE) structures (e.g., the JTE 130) of respective implementations of the semiconductor device of FIGS. 1 and 2 along a one-dimensional cut line 3-3 in FIG. 1. In the graphs of FIGS. 3A-3C, arbitrary units (a.u.) of depth (e.g., in the epitaxial layer 114) are represented on the x-axes, while arbitrary units (a.u.) for concentration of active impurities (e.g., p-type impurities) are shown, using a logarithmic scale, on the y-axes. Again, the graphs of FIGS. 3A-3C are schematic, and given by way of example to illustrate example doping profiles and active p-type impurity concentrations in example implementations of the semiconductor device 100.

It is noted that, for correspondence with FIG. 1, while depths are shown vertically (e.g., from top bottom) in FIG. 1, those depths are represented horizontally in FIGS. 3A-3C (e.g., from left to right). In FIGS. 3A-3C, the respective range of depths associated with the layer 132, the layer 134 and the layer 136 in the epitaxial layer 114 of the semiconductor device 100 of FIG. 1 are indicated along the top of the graphs in FIGS. 3A-3C, with those depth ranges also being illustrated (indicated) by the rectangles in FIGS. 3A-3C.

Referring to FIG. 3A, a graph 300 illustrating a first active p-type impurity concentration profile that can be used to implement the JTE 130 of the semiconductor device 100 is shown. In the graph 300, an n-type (constant) active doping concentration of the epitaxial layer 114 is shown by a trace 305. The trace 305 is shown in each of FIGS. 3A-3C for comparison with the respective active p-type impurity concentrations of the JTE 130. In FIG. 3A, a trace 310 illustrates the active p-type impurity concentration for this example. The trace 310 includes a first peak 312 in the layer 132, and a second peak 314 in the layer 134. The active p-type impurity concentration the layer 136 (the high hole mobility layer) has a constant portion 316 between the peak 312 and the peak 314.

The active p-type impurity concentration shown in FIG. 3A can be defined (produced, etc.) using multiple impurity implants. For instance, a first impurity implant can be performed at a low implantation energy (e.g., corresponding with the peak 312) and a second impurity implant can be performed at a high implantation energy (e.g., corresponding with the peak 314). In some implementations, a third implant can be performed at a medium implantation energy (e.g., corresponding with the constant portion 316). In this example, the peak 312 and the peak 314 are of a same value, or approximately a same value on the y-axis. In example implementations, such an impurity profile can be produced using a same implant dose for the first impurity implant and the second impurity implant noted above, and a desired total doping concentration in the JTE 130 can be achieved by appropriately dividing an implant dose among the multiple implants, (e.g., two, three, or more) used to produce the JTE.

Referring to FIG. 3B, a graph 320 illustrating a second active p-type impurity concentration profile that can be used to implement the JTE 130 of the semiconductor device 100 is shown. Such an impurity concentration can be implemented in JTEs (e.g., the JTE 130) included in semiconductor devices that do not experience depletion (e.g., significant depletion, etc.) from an upper surface (e.g., an upper surface of the JTE). In some implementations, such depletion (e.g., from an upper surface) can depend on (result from) surface charge and an upper metal plate structure. In the graph 320, the n-type (constant) active doping concentration of the epitaxial layer 114 is shown by the trace 305. In FIG. 3B, a trace 330 illustrates the active p-type impurity concentration for this example. The trace 330 includes a first peak 332 in the layer 132, and a second peak 334 in the layer 134. The active p-type impurity concentration in the layer 136 (the high hole mobility layer) has a constant portion 336 between the peak 332 and the peak 334.

As with the active p-type impurity concentration profile of FIG. 3A, the active p-type impurity concentration profile shown in FIG. 3B can be defined (produced, etc.) using multiple impurity implants. For instance, a first impurity implant can be performed at a low implantation energy (e.g., corresponding with the peak 332) and a second impurity implant can be performed at a high implantation energy (e.g., corresponding with the peak 334). In some implementations, a third implant can be performed at a medium implantation energy (e.g., corresponding with the constant portion 336).

In this example, the peak 332 and the peak 334 are of different values (e.g., on the y-axis), where the peak 334 indicates a higher active doping concentration than the peak 332. In example implementations, such an impurity profile can be produced using a lower implant dose for the first implant than an implant dose used for the-second implant, also taking into consideration the relationship between total doping concentration and ionization degree. As with the active p-type impurity concentration of FIG. 3A, the desired total doping concentration in the JTE 130 to produce the profile of the graph 330 can be achieved by appropriately dividing a dose among the multiple implants, (e.g., two, three, or more) used to form the JTE 130.

Referring to FIG. 3C, a graph 340 illustrating a third active p-type impurity concentration profile that can be used to implement the JTE 130 of the semiconductor device 100 is shown. Such an impurity concentration can be implemented to define a high hole mobility layer (layer 136) that covers more depth (e.g., from D1 to D2 in FIG. 1) than respective depth ranges of the layer 132 and the layer 134. In the graph 340, the n-type (constant) active doping concentration of the epitaxial layer 114 is shown by the trace 305. In FIG. 3C, a trace 350 illustrates the active p-type impurity concentration for this example. The trace 350 includes a first peak 352 in the layer 132, and a second peak 354 in the layer 134. The active p-type impurity concentration in the layer 136 (the high hole mobility layer) has an increasing portion 356 between the peak 352 and the peak 354.

As with the active p-type impurity concentration of FIGS. 3A and 3B, the active p-type impurity concentration shown in FIG. 3C can be defined (produced, etc.) using multiple impurity implants. For instance, a first impurity implant can be performed at a low implantation energy (e.g., corresponding with the peak 352) and a second channeling impurity implant can be performed to define (produce, etc.) the peak 354 (e.g., in the layer 134) and the increasing portion 356 (e.g., in the layer 136). As with the active p-type impurity concentrations of FIGS. 3A and 3B, the desired total doping concentration in the JTE 130 to achieve the profile of the graph 340 can be achieved by appropriately dividing a dose among the multiple implants, (e.g., two, three, or more) used to form the JTE 130.

Figure 4:
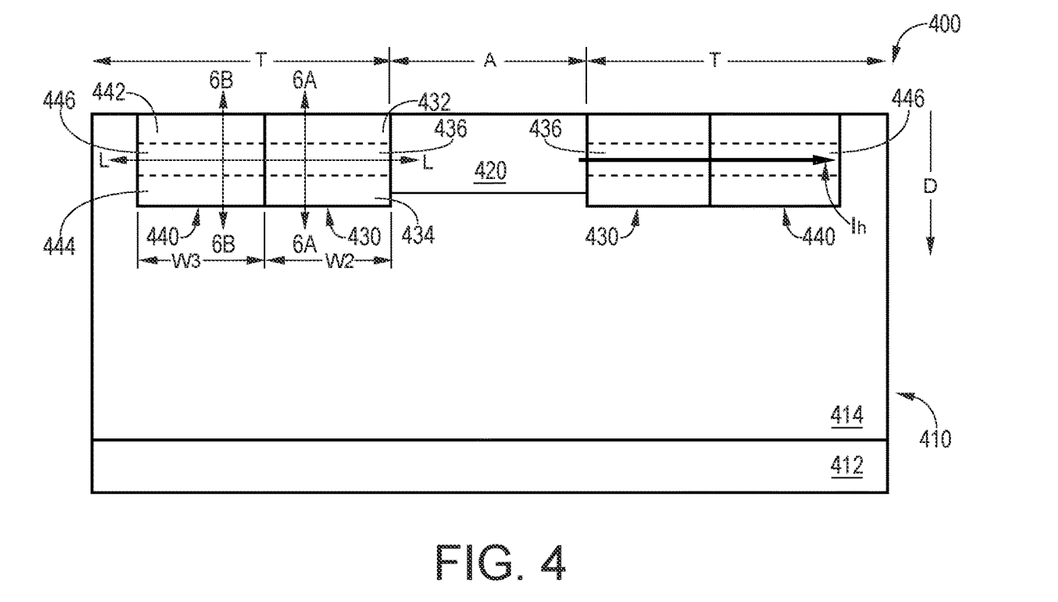
FIG. 4 is a diagram that schematically illustrates a cross-sectional view of another semiconductor device including an active region and a termination region.
Figure 5:
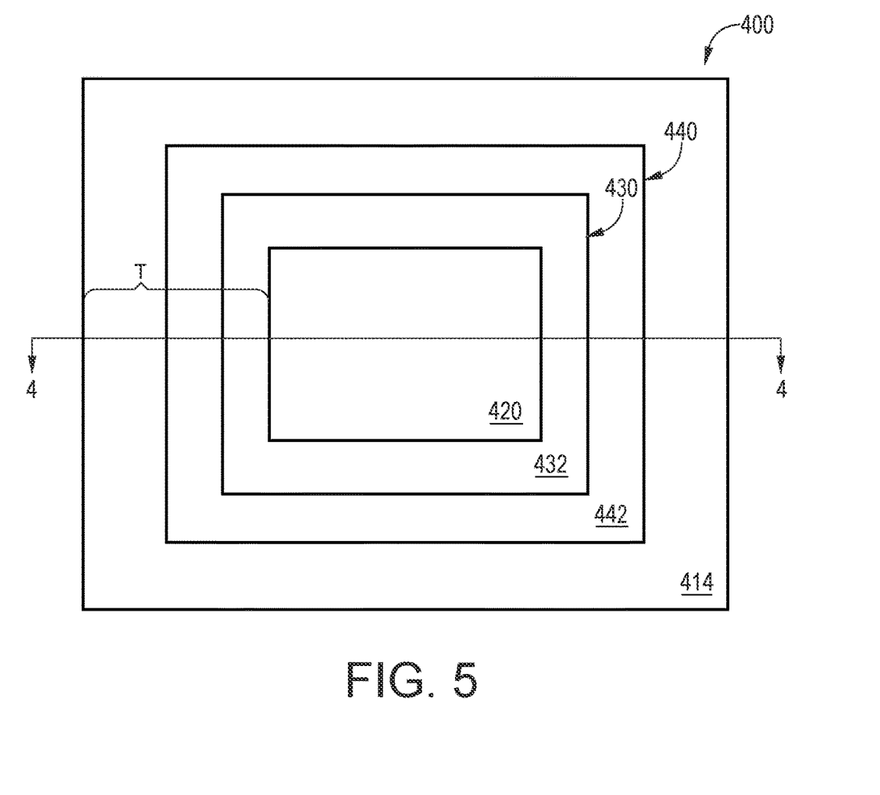
FIG. 5 is a diagram schematically illustrating a plan (top down) view of the semiconductor device of FIG. 4.

FIG. 4 is a diagram that schematically illustrates a cross-sectional view of a semiconductor device 400 including an active region A and a termination region T. FIG. 5 is a diagram that schematically illustrates a plan (top down) view of the semiconductor device 400 of FIG. 4. A section line 4-4 is shown in FIG. 5, which corresponds with the cross-sectional view of the semiconductor device 400 illustrated in FIG. 4. Accordingly, FIGS. 4 and 5 will be described with reference to one another.

In some implementations, the approaches illustrated in FIGS. 4 and 5 can be used to implement semiconductor devices operating at higher voltages than the semiconductor device 100. For instance, while implementations of the semiconductor device 100 can operate with ratings (e.g., breakdown voltage ratings) in the range of 1.2 kilovolts (kV), implementations of the semiconductor device 400 can operate with voltage ratings of 1.7 kV or higher (e.g., due, in part, to the use of multiple JTEs).

As shown in FIGS. 4 and 5, with further reference to FIG. 1, the semiconductor device 400 includes similar elements as the semiconductor device 100, which are referenced in FIGS. 4 and 5 with 400 series numbers corresponding with the 100 series reference numbers in FIG. 1. For purposes of brevity, the elements of the semiconductor device 400 that correspond with elements of the semiconductor device 100 of FIG. 1 are identified below, but are not described in detail again here.

Referring to FIG. 4, and corresponding with elements of the semiconductor device 100 of FIG. 1, the semiconductor device 400 includes a semiconductor substrate 410 (e.g. a SiC substrate), which can include a heavily doped (n+) SiC substrate 412 and a lightly doped (n−) SiC epitaxial layer (epitaxial layer 414). The semiconductor device 400 includes, in the active region A, an active device region 420 that is disposed in the epitaxial layer 414.

As also shown in FIG. 4, the semiconductor device 400 also includes a termination region T. The termination region T of the semiconductor device 400 includes a (p-type) junction termination extension (a first JTE 430). As shown by FIG. 4, with further reference to FIG. 5, the termination region T (e.g., the first JTE 430, as well as other elements in the termination region T) can, at least partially surround, or can fully surround the active device region 420, such as surround (or partially surround) a perimeter of the active device region 420, as shown in FIG. 5.

As additionally shown in FIG. 4, the first JTE 430 can extend (vertically in FIG. 4), along the line D, from a surface (e.g., an upper surface in FIG. 4) of the epitaxial layer 414 and can include a plurality of regions or layers. For instance, the first JTE 430 can include a layer 432, a layer 434 and a layer 436. In the examples described herein, the layer 432 can be a first depletion stopper (e.g., heavily p-type doped) layer, and the layer 434 can be a second depletion stopper (e.g., heavily p-type doped) layer. Further in the semiconductor device 400, the layer 436 can be a first high carrier (hole) mobility layer, where the layer 436 is, relative to the layer 432 and the layer 434, lightly (p-type) doped. The first JTE 430, which has a width W2 indicated in FIG. 4, can have width and depth dimensions similar to those described with respect to the JTE 100 of FIG. 1, where the specific dimensions can depend on the particular implementation.

In addition to the elements of the semiconductor device 400 corresponding with the semiconductor device 100, the semiconductor device 400 also includes a second JTE 440 (e.g., second p-type JTE) that is disposed in the termination region T. As shown by FIG. 4, with further reference to FIG. 5, the second JTE 440 can at least partially surround, or can fully surround the first JTE 430, such as surround a perimeter of (or a portion of) the first JTE 430, as shown in FIG. 5.

As shown in FIG. 4, as with the first JTE 430, the second JTE 440 can extend (vertically in FIG. 4), along the line D, from a surface (e.g., the upper surface in FIG. 4) of the epitaxial layer 414 and can include a plurality of regions or layers. For instance, in the semiconductor device 400, the second JTE 440 can include a layer 432, a layer 434 and a layer 436. In the examples described herein, the layer 432 can be a third depletion stopper (e.g., heavily p-type doped) layer of the semiconductor device 400, and the layer 434 can be a fourth depletion stopper (e.g., heavily p-type doped) layer of the second JTE 440. Further in the semiconductor device 400, the layer 436 can be a second high carrier (hole) mobility layer, where the layer 436 is, relative to the layer 432 and the layer 434, lightly (p-type) doped. As shown in FIG. 4, the layer 436 and the layer 446 (high hole mobility layers) can be aligned with one another along a longitudinal axis L. Such an arrangement prevents any breaks in the high mobility hole conduction path for the hole current $I_h$ through the layer 436 and the layer 446. As with the layer 436, as a result of the lower doping of the layer 446, in this example (e.g., where the semiconductor substrate 410 is a SiC substrate and the epitaxial layer 414 is a SiC epitaxial layer), an ionization degree of the p-type dopant in the layer 446 can be higher than in the layer 442 or the layer 444. Because of the higher ionization degree of p-type dopant in the layer 446, hole mobility in the layer 446 can be higher than in the layer 442, or in the layer 444. Accordingly, hole conductance (e.g., during soft-switching) can be improved (e.g., over previous approaches), and DynCoss loss can, in turn, be reduced.

As shown in FIG. 4, the second JTE 440 can have a width W3, which, depending on the particular implementations, can be a same with as the width W2 of the first JTE 430, or can be a different width. Further, in some implementations, a total doping concentration of the second JTE 440 can be less than a total doping concentration of the first JTE 430, which can improve ruggedness and breakdown performance of the semiconductor device 400. The layers of the second JTE 440 can have similar depth relationships, attributes, etc., as the layers of the first JTE 430, though other arrangements are possible.

As shown in FIG. 4, and noted above, the layers 436 and 446 can provide (e.g., during resonant, soft-switching devices in the active device region 420), a high conductance (e.g., low resistance) conduction path for the hole current $I_h$, which can reduce associated DynCoss loss. The layers of the first JTE 430 and the layers of the second JTE 440 can be produced (defined, etc.) by respective multi-peaked doping concentration profiles, such as the example doping profiles schematically illustrated in FIG. 6. That is, each of the layers of the first JTE 430 and the second JTE 440 can have respective doping concentration profiles, with relative doping concentration levels similar to those discussed above with respect to the layers of the JTE 130 of the semiconductor device 100.

Figure 6:
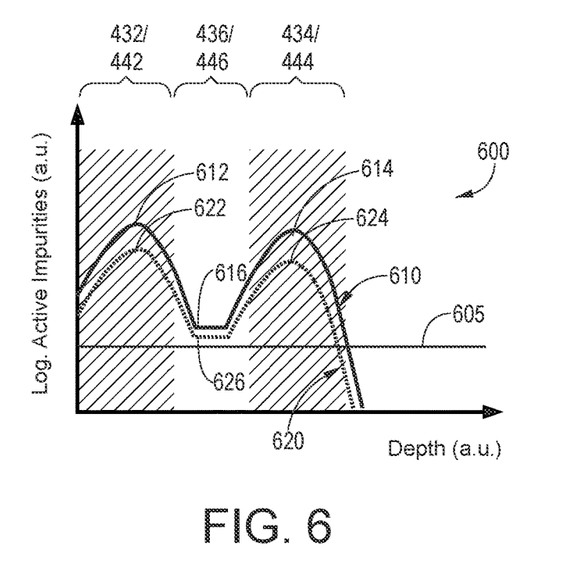
FIG. 6 is a graph illustrating an active impurity distributions for JTE structures of an implementation of the semiconductor device of FIGS. 4 and 5.

FIG. 6 is a graph 600 schematically illustrating example active p-type impurity distributions for junction termination extension (JTE) structures (e.g., the first JTE 430 and the second JTE 440) of an example implementation of the semiconductor device 400 of FIGS. 4 and 5 along respective 1D cut lines 6A-6A and 6B-6B in FIG. 4. In the graph 600 of FIG. 6, as with the graphs of FIGS. 3A-3C, arbitrary units (a.u.) of depth (e.g., in the epitaxial layer 414) are represented on the x-axis, while arbitrary units (a.u.) for concentration of active impurities (e.g., p-type impurities) are shown, logarithmically, on the y-axis. Again, the graph 600 is schematic, and given by way of example to illustrate an example doping profiles and active p-type impurity concentrations in an example implementation of the semiconductor device 400.

As with the graphs of FIGS. 3A-3C, while depths are shown vertically (e.g., from top bottom) in FIG. 4, those depths are represented horizontally in FIG. 6 (e.g., from left to right). In FIG. 6, the respective range of depths associated with the layers of the first JTE 430 and the second JTE 440 in the epitaxial layer 414 of the semiconductor device 400 of FIG. 4 are indicated along the top of the graph 600, with those depth ranges also being illustrated (indicated) by the rectangles in FIG. 6.

In this example, the graph 600 illustrates active p-type impurity concentration profiles that can be used to implement, respectively, the first JTE 430 and second JTE 440 of the semiconductor device 400. In graph 600, an n-type (constant) active doping concentration of the epitaxial layer 414 is shown by a trace 605, e.g., for comparison with the respective active p-type impurity concentrations of the first JTE 430 and the second JTE 440.

In FIG. 6, a trace 610 illustrates the active impurity concentration for the first JTE 430 of this example, while a trace 620 illustrates the active impurity concentration for the second JTE 440. As shown in FIG. 6, the trace 610 includes a first peak 612 in the layer 432, and a second peak 614 in the layer 434. The active impurity concentration of the layer 436 (the first high hole mobility layer) has a constant portion 616 between the peak 612 and the peak 614. The trace 620 includes a first peak 622 in the layer 442, and a second peak 624 in the layer 444. The active impurity concentration of the layer 446 (the second high hole mobility layer) has a constant portion 626 between the peak 622 and the peak 624, where the constant portion 626 is aligned with the constant portion 616, such that the corresponding high hole mobility layers 436 and 446 are aligned, as shown in FIG. 4.

The active impurity concentrations (e.g., of the traces 610 and 620) shown in FIG. 6 can be defined (produced, etc.) using multiple impurity implants, such as discussed above with respect to, e.g., FIGS. 3A-3C. In this example, the total active impurities of the profiles shown by the traces 610 and 620 are different (e.g., the total p-type impurities included in the second JTE 440 is less than the total p-type impurities included in the first JTE 430). In example implementations, such active impurity profiles can be produced using a series of implants with respective energies and doses to produce the active impurity profiles for the first JTE 430 and the second JTE 440 shown in FIG. 6.

Figure 7:
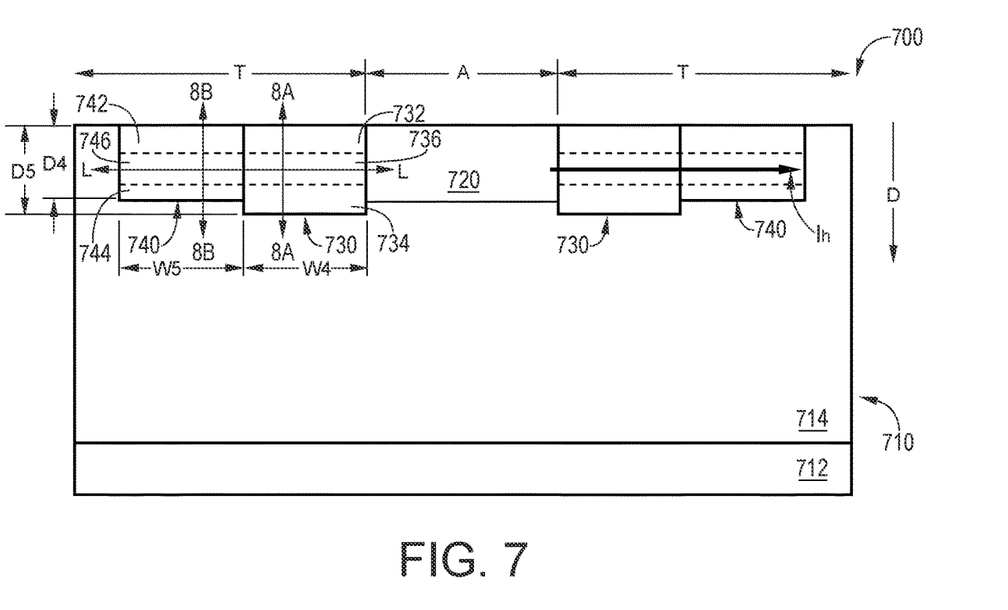
FIG. 7 is a diagram that schematically illustrates a cross-sectional view of another semiconductor device including an active region and a termination region.

FIG. 7 is a diagram that schematically illustrates a cross-sectional view of a semiconductor device 700 including an active region A and a termination region T, which is similar to the semiconductor device 400 of FIG. 4 (and has a top view corresponding with FIG. 5). Also, the semiconductor device 700, as with the semiconductor device 400, can be used to implement semiconductor devices operating at higher voltages, such as at voltage ratings of 1.7 kV or higher (e.g., due, in part, to the use of multiple JTEs).

The semiconductor device 700 includes similar elements as the semiconductor device 400 and the semiconductor device 100. Those elements are referenced in FIG. 7 with 700 series numbers corresponding with the 400 series reference numbers in FIG. 4. For purposes of brevity, the elements of the semiconductor device 700 that correspond with elements of the semiconductor device 400 (and the semiconductor device 100) are identified below These corresponding elements in FIG. 7 include a semiconductor substrate 700, including a heavily doped (n-type SiC) substrate 712 and a lightly doped n-type SiC epitaxial layer (epitaxial layer 714). The corresponding elements further include an active region A, an active device region 720, a termination region T, a first JTE 730 (with layers, 732, 734 and 736), and a second JTE 740 (with layers 742, 744 and 746). The line D is also shown in FIG. 7, for reference and comparison with FIGS. 1 and 4. These elements, other than differences with the semiconductor device 400 (and the semiconductor device 100), are not described again in detail here.

As shown in FIG. 7, the first JTE 730 can have a width W4 and a depth D5, while the second JTE 740 can have a width W5 and a depth D4. As shown in FIG. 7, D4 can be less than D5. Likewise, W5 can be less than W4 (or can be the same as, or greater than W4). In this example, even though the depth D4 of the second JTE 740 is less than the depth D5 of the first JTE 730, the layers 736 and 746 (high hole mobility layers) are still aligned with each other along the longitudinal axis L, so as to efficiently conduct $I_h$ (e.g., during soft-switching operation) and reduce DynCoss loss.

Figure 8:
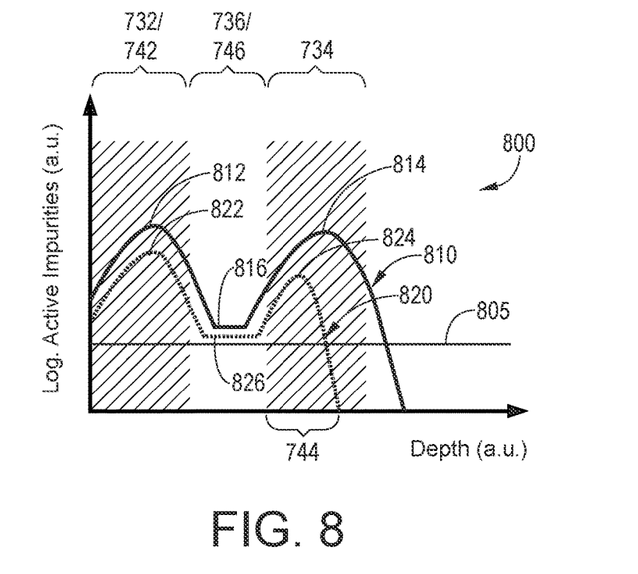
FIG. 8 is a graph illustrating an active impurity distributions for junction termination extension (JTE) structures of an implementation of the semiconductor device of FIG. 7.

FIG. 8 is a graph 800 schematically illustrating example active p-type impurity distributions for the first JTE 730 and the second JTE 740 of the semiconductor device 700 along respective 1D cut lines 8A-8A and 8B-8B in FIG. 7. In the graph 800, as with the graph 600, arbitrary units (a.u.) of depth are represented on the x-axis, while arbitrary units (a.u.) for concentration of active impurities (e.g., p-type impurities) are shown, logarithmically, on the y-axis. Again, the graph 800 is schematic, and given by way of example to illustrate example doping profiles and active p-type impurity concentrations in an example implementation of the semiconductor device 700.

As with the examples discussed above, vertical depths in FIG. 7 are represented horizontally in FIG. 8. In FIG. 8, the respective range of depths associated with the layers of the first JTE 730 and the second JTE 740 are indicated along the top and bottom of the graph 800, with at least some of those depth ranges also being illustrated (indicated) by the rectangles in FIG. 8.

In this example, the graph 800 illustrates active p-type impurity concentration profiles that can be used to implement, respectively, the first JTE 730 and second JTE 740 of the semiconductor device 700. In graph 800, an n-type (constant) active doping concentration of the epitaxial layer 714 is shown by a trace 805.

In FIG. 8, a trace 810 illustrates the active impurity concentration for the first JTE 730, while a trace 820 illustrates the active impurity concentration for the second JTE 740. As shown in FIG. 8, the trace 810 includes a first peak 812 in the layer 732, and a second peak 814 in the layer 734. The active impurity concentration of the layer 736 (the first high hole mobility layer) has a constant portion 816 between the peak 812 and the peak 814. The trace 820 includes a first peak 822 in the layer 742, and a second peak 824 in the layer 744. The active impurity concentration of the layer 746 (the second high hole mobility layer) has a constant portion 826 between the peak 822 and the peak 824, where the constant portion 826 is aligned with the constant portion 816, such that the corresponding high hole mobility layers 736 and 746 are aligned, as shown in FIG. 7. The active impurity concentrations (e.g., of the traces 810 and 820) shown in FIG. 8 can be defined (produced, etc.) using multiple impurity implants, such as the approaches discussed herein.

Figure 9:
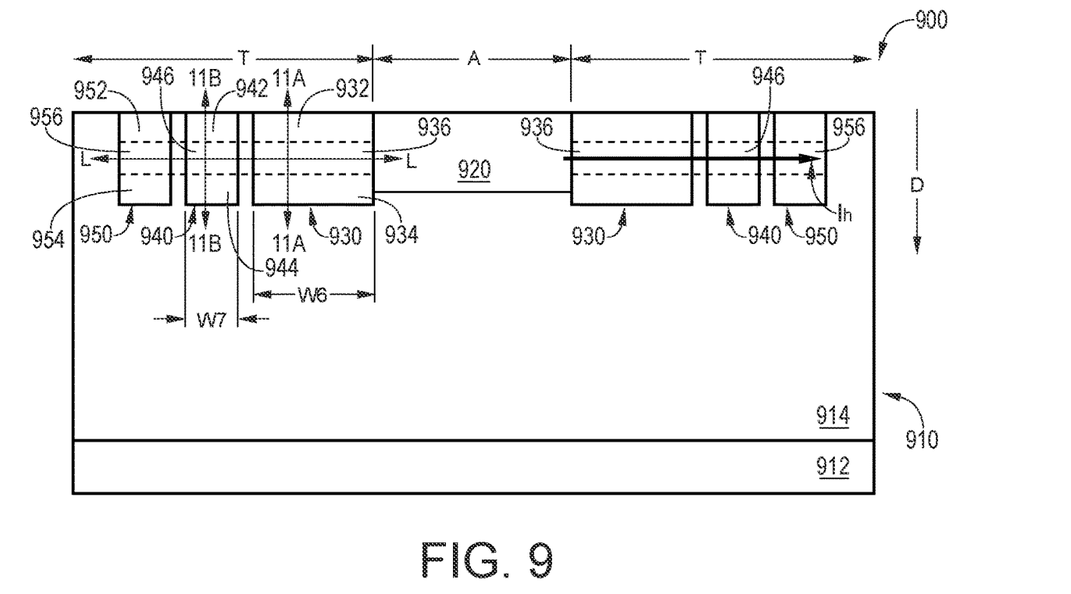
FIG. 9 is a diagram that schematically illustrates a cross-sectional view of another semiconductor device including an active region and a termination region.
Figure 10:
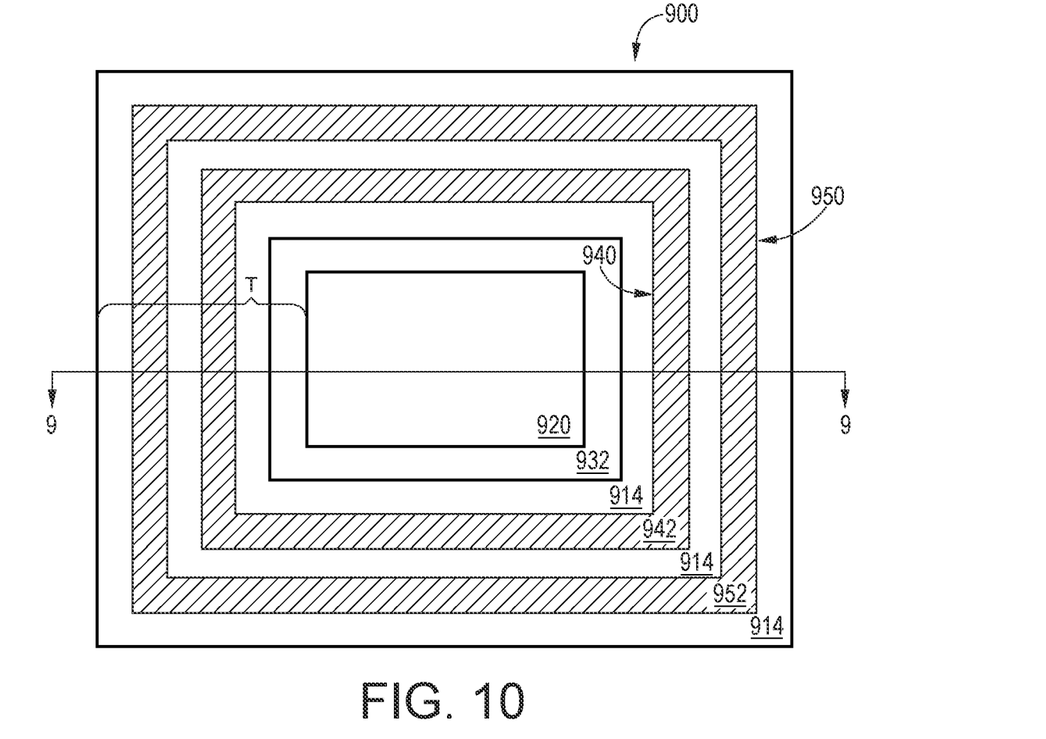
FIG. 10 is a diagram schematically illustrating a plan (top down) view of the semiconductor device of FIG. 9.

FIG. 9 is a diagram that schematically illustrates a cross-sectional view of a semiconductor device 900 including an active region A and a termination region T, which is similar to the semiconductor device 100 FIG. 1, but includes, in this example, two floating (p-type) guard rings, and has a top view corresponding with FIG. 10. In some implementations, fewer or additional floating guard rings can be included. In some implementations, the semiconductor device 900, can be used to implement semiconductor devices that are configured to operate across a range of voltages, such as 100 V to 1200 V, with, in some implementations, improved (e.g., reduced) DynCoss loss at lower voltages (e.g., less than 500 V) than implementations of the semiconductor device 100, where example implementations of the semiconductor device 100 can have better DynCoss loss performance at higher voltages (e.g., greater than 500 V).

The semiconductor device 900 includes similar elements as the semiconductor device 100. Those elements are referenced in FIG. 9 with 900 series numbers corresponding with the 100 series reference numbers in FIG. 1. For purposes of brevity, the elements of the semiconductor device 900 that correspond with elements of the semiconductor device 100 are identified below.

These corresponding elements in FIG. 9 include a semiconductor substrate 900, including a heavily doped (n-type SiC) substrate 912 and a lightly doped n-type SiC epitaxial layer (epitaxial layer 914). The corresponding elements further include an active region A, an active device region 920, a termination region T, and a JTE 930 (with layers, 932, 934 and 936). The line D is also shown in FIG. 9, for reference and comparison with FIG. 1 (and FIGS. 4 and 7). These elements, other than differences with the semiconductor device 100, are not described again in detail here.

In addition to the elements of the semiconductor device 900 corresponding with the semiconductor device 100, the semiconductor device 900 also includes a first (p-type) floating ring 940 and a second (p-type) floating ring 950 that are disposed in the termination region T. As shown by FIG. 9, with further reference to FIG. 10, the first floating ring 940 can be spaced (e.g., laterally spaced) from the JTE 930, and the floating ring 950 can be spaced (e.g., laterally) from the first floating ring 940. The floating rings 940 and 950 can, as shown in FIG. 10, at least partially surround, or can fully surround the JTE 930, such as surround a perimeter of (or a portion of) the first JTE 930.

As shown in FIG. 9, as with the JTE 930, the floating rings 940 and 950 can extend (vertically in FIG. 9), along the line D, from the upper surface of the epitaxial layer 914 and can each include a plurality of regions or layers. For instance, the floating rings 940 and 950 can include, as shown in FIG. 9, depletion stopper layers 942, 944, 952 and 954, and high hole mobility layers 946 and 956. As shown in FIG. 9, the layers 936, 946 and 956 (the high hole mobility layers) can be aligned with one another along the longitudinal axis L. Such an arrangement can reduce resistance (e.g. increase conductance) of a high mobility hole conduction path for the hole current $I_h$ through the aligned layers. That is, in such implementations, lower doping concentration and an associated higher ionization degree of p-type dopant in the layers 936, 946 and 956 can increase hole mobility in those layers, thereby increasing hole conductance (e.g., during soft-switching), which can improve (reduce) DynCoss loss.

As shown in FIG. 9, the JTE 930 can have a width W6, and the floating rings 940 and 950 can have a width W7 (or can have different widths from one another), which, depending on the particular implementation, can be less than the width W6 of the JTE 930. Further, in some implementations, a doping concentration of the floating rings 940 and 950 (even when produced using the same implants as the JTE 930) can be less than a doping concentration of the JTE 930. This difference in doping concentration can be a result of 2-dimensional diffusion differences in the floating rings 940 and 950, as compared to the JTE 930. In some implementations, the layers of the floating rings 940 and 950 can have similar depth relationships, attributes, etc., as the layers of the JTE 930, though other arrangements are possible.

Figure 11:
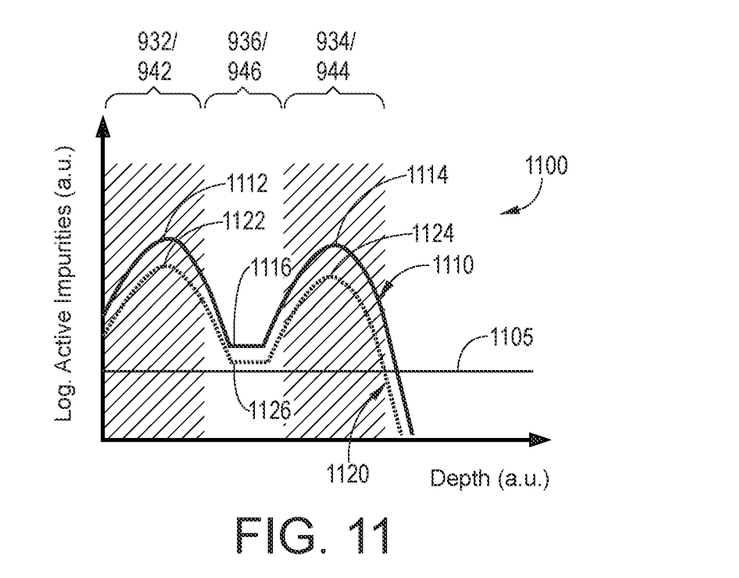
FIG. 11 is a graph illustrating an active impurity distributions for junction termination extension (JTE) structures of an implementation of the semiconductor device of FIGS. 9 and 10.

FIG. 11 is a graph 1100 that schematically illustrates example active p-type impurity distributions for the JTE 930 and the floating rings 940 and 950 of the semiconductor device 900 along respective 1D cut lines 11A-11A and 11B-11B in FIG. 9. In the graph 1100, as with the previously discussed active impurity graphs, arbitrary units (a.u.) of depth are represented on the x-axis, while arbitrary units (a.u.) for concentration of active impurities (e.g., p-type impurities) are shown, logarithmically, on the y-axes. Again, the graph 1100 is schematic, and given by way of example to illustrate example doping profiles and active p-type impurity concentrations in an example implementation of the semiconductor device 900.

As with the examples discussed above, vertical depths in FIG. 9 are represented horizontally in FIG. 11. In FIG. 11, the respective range of depths associated with the layers of the JTE 930 and the example floating ring 940 (which is also representative of the floating ring 950, in this example) are indicated along the top of the graph 1100, with those depth ranges also being illustrated (indicated) by the rectangles in FIG. 11.

In this example, the graph 1100 illustrates active p-type impurity concentration profiles that can be used to implement, respectively, the JTE 930, and the floating rings 940 and 950 of the semiconductor device 900. In graph 1100, an n-type (constant) active doping concentration of the epitaxial layer 914 is shown by a trace 1105.

In FIG. 11, a trace 1110 illustrates the active impurity concentration for the JTE 930, while a trace 920 illustrates the active impurity concentration for the floating ring 940. As shown in FIG. 11, the trace 910 includes a first peak 1112 in the layer 932, and a second peak 914 in the layer 934. The active impurity concentration of the layer 936 (high hole mobility layer) has a constant portion 1116 between the peak 1112 and the peak 1114. The trace 920 (representative of the floating rings 940 and 950) includes a first peak 1122 in the layer 942 (or the layer 952), and a second peak 1124 in the layer 944 (or the layer 954). The active impurity concentration of the layer 946 (or layer 956, high hole mobility layers) has a constant portion 1126 between the peak 1122 and the peak 1124, where the constant portion 1126 is aligned with the constant portion 1116, such that the corresponding high hole mobility layers 936, 946 (and 956) are aligned, such as shown in FIG. 9. The active impurity concentrations (e.g., of the traces 1110 and 1120) shown in FIG. 11 can be defined (produced, etc.) using multiple impurity implants, such as the approaches discussed herein.

Figure 12A:
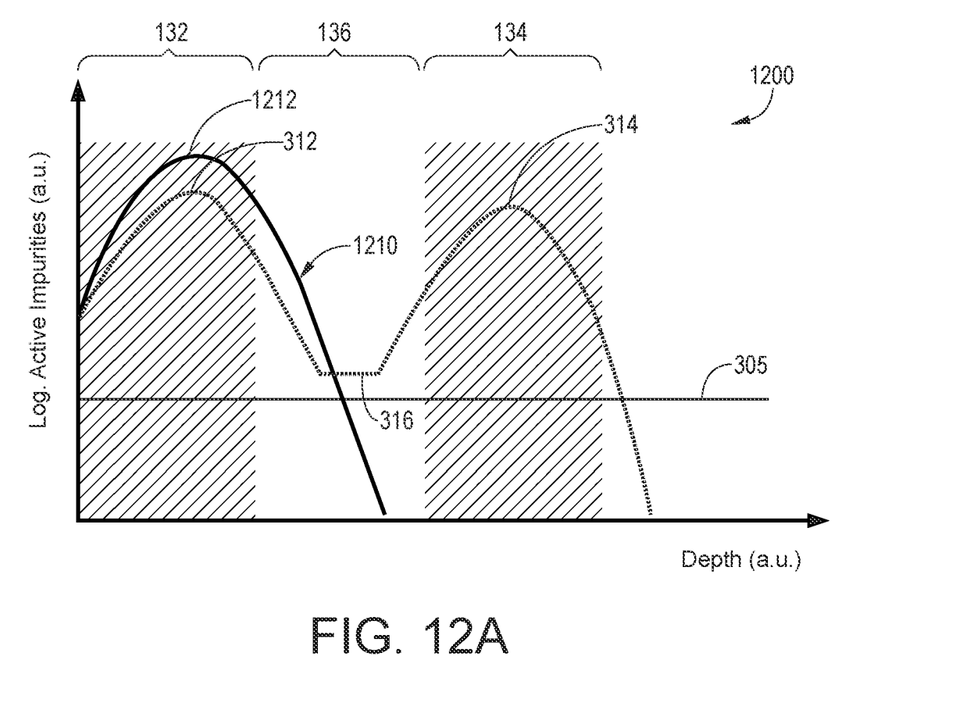
FIGS. 12A and 12B are graphs schematically illustrating a relationship of doping concentration profile and carrier mobility for an implementation of the device of FIG. 1 as compared to a relationship of doping concentration profile and carrier mobility for a prior approach.
Figure 12B:
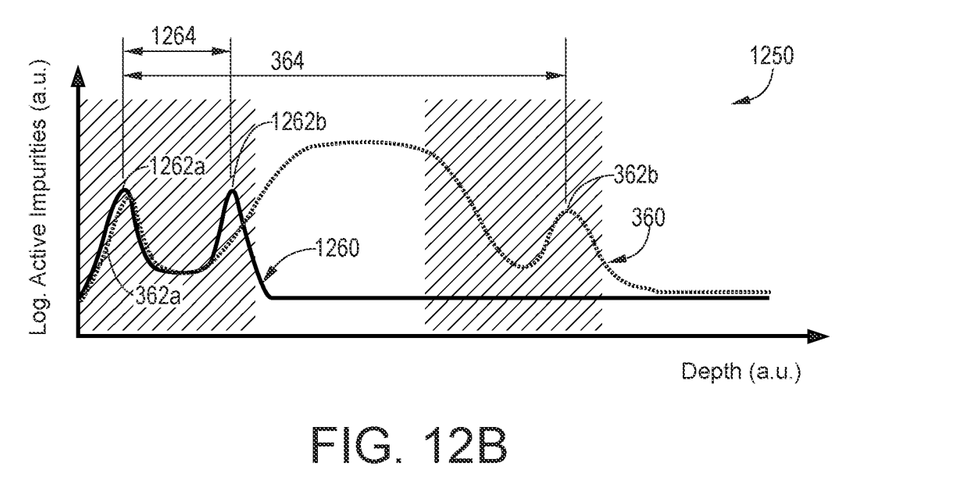

FIGS. 12A and 12B are graphs that schematically illustrate a relationship of doping concentration profile and carrier mobility for an implementation of the device of FIG. 1, as compared to a relationship of doping concentration profile and carrier mobility for a prior approach. Specifically, FIG. 12A shows the schematic doping concentration profile of FIG. 3A (e.g., illustrated by the trace 310), which is referenced with like reference numbers as FIG. 3A (e.g., for regions 132, 134 and 136 of the device 100 of FIG. 1). Also in FIG. 12A, the active doping concentration of the epitaxial layer 114 of the device 100 of FIG. 1 is shown by the trace 305, as in FIG. 3A.

As with FIG. 3A, FIG. 12A also illustrates active impurities (on a logarithmic scale) versus depth (both shown using arbitrary units, a.u.). For purposes of brevity and clarity, the details of the doping concentration illustrated by the trace 305 is not described in detail again with respect to FIGS. 12A and 12B. Also shown in FIG. 12A is a trace 1210, which illustrates a doping concentration profile (e.g., a single peak profile) of a prior approach. In some implementations, a total charge associated with the doping concentration profile illustrated by the trace 310 can be approximately the same as the total charge associated with the doping concentration profile illustrated by the trace 1210 (which may not be readily apparent from FIG. 12A due to the logarithmic scale of the y-axis).

Referring now to FIG. 12B, a graph 1250 shows respective carrier (hole) mobility profiles corresponding with the doping concentration profiles of the trace 310 and the trace 1210 in FIG. 12A during a high-frequency switching event (e.g., a fast drain to source voltage charging or discharging). In FIG. 12B, hole mobility (in a.u.) is indicated on the y-axis, while depths (corresponding with the a.u. depths of FIG. 12A) are shown on the y-axis. In FIG. 12B, carrier (hole) mobility over the depths for the doping profile corresponding with the trace 310 (e.g., the example of FIG. 3A) is shown by the trace 360, while carrier (hole) mobility over the depths for the doping profile corresponding with the trace 1210 (e.g., the prior approach of FIG. 12A) is shown by the trace 1260.

As shown in FIG. 12B, a range of depths 364 over which there is increased carrier (hole) mobility for the trace 360 is larger than a range of depths 1264 over which there is increased carrier (hole) mobility for the trace 1260. This difference in range of depths, or extension of respective neutral depletion regions during fast drain-source voltage ramps (which is referred to as $W_{term}$ below) can contribute to reductions in DynCoss loss. For instance, the range of depths 364 (e.g., undepleted or neutral depletion) defines, in part, a cross section where capacitive (displacement) current $I_h$ will flow during Coss charging and/or discharging. While in the examples described herein, this current is discussed as being a hole current, in some implementations, this current could be an electron current.

The extension of an undepleted (neutral depletion) region in the example implementations, as compared to prior approaches (e.g., the range of depths 364 compared to the range of depths 1264) can contribute to reduced resistance of a termination region (e.g., during high-frequency switching events) and, accordingly, reduce DynCoss losses. For instance, power losses during Coss charging and/or discharging will be proportional to resistance along the undepleted region of a JTE (e.g., such as the JTE 130 in this example). The following equations illustrate how the approaches described herein can reduce resistance and, in turn reduce DynCoss loss.

Equation 1 below can be used to calculate resistivity (ρ) for example implementations, such as for the JTE 130 of FIG. 1. In Equation 1 below, $\mu_{avg}$ is average carrier (e.g., hole) mobility over the cross section where $I_h$ flows, $N_{Aavg}$ is average acceptor density over the cross section and q is total charge. In this example, ρ can be given by:

$$\rho = \frac{1}{\mu_{avg} \cdot N_{Aavg} \cdot q} \qquad \text{Equation 1}$$

As can be seen from Equation 1, the increased average carrier mobility associated with the trace 360 will decrease resistivity, and in turn reduce overall resistance (R), which can be given by:

$$R = \rho \cdot \frac{L_{term}}{T_{term} \cdot W_{term}} \qquad \text{Equation 2}$$

where $L_{term}$ and $T_{term}$ are additional dimension parameters for an example JTE (such as the JTE 130). For instance, a cross section of the JTE can be defined by $L_{term}$ and $W_{term}$, while a length of the JTE can be defined by $L_{term}$. As can be seen from Equation 2, increasing $W_{term}$ results in a reduction of R and, in turn, an associated reduction in DynCoss loss.

It will be understood, for purposes of this disclosure, that when an element, such as a layer, a region, or a substrate, is referred to as being on, disposed on, connected to, electrically connected to, coupled to, or electrically coupled to another element, it may be directly on, connected or coupled to the other element, or one or more intervening elements may be present. In contrast, when an element is referred to as being directly on, directly disposed on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to, vertically adjacent to, or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), gallium arsenide (GaAs), gallium nitride (GaN), silicon carbide (SiC), and/or so forth.

While certain features of various example implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device:
a substrate of a first conductivity type;
an active region disposed in the substrate, the active region including at least one active device; and
a termination region disposed in the substrate adjacent to the active region, the termination region excluding an active device, the termination region including a junction termination extension (JTE) of a second conductivity type, the second conductivity type being opposite the first conductivity type, the JTE having:
a first depletion stopper region disposed in an upper portion of the JTE;
a second depletion stopper region disposed in a lower portion of the JTE; and
a high carrier mobility region disposed between the first depletion stopper region and the second depletion stopper region, the high carrier mobility region having a constant doping region extending over a range of depths of the high carrier mobility region in the substrate, the high carrier mobility region having a carrier mobility that is greater than respective carrier mobilities of the first depletion stopper region and the second depletion stopper region.

2. The semiconductor device of claim 1, wherein:
the first depletion stopper region has a first doping concentration;
the second depletion stopper region has a second doping concentration; and
the high carrier mobility region has a third doping concentration, the third doping concentration being less than the first doping concentration, and less than the second doping concentration.

3. The semiconductor device of claim 2, wherein the first doping concentration and the second doping concentration are a same doping concentration.

4. The semiconductor device of claim 2, wherein the first doping concentration is different than the second doping concentration.

5. The semiconductor device of claim 2, wherein:
the first doping concentration is a first average doping concentration;
the second doping concentration is a second average doping concentration; and
the third doping concentration is a third average doping concentration.

6. The semiconductor device of claim 1, wherein:
the substrate is a silicon carbide substrate;
the first conductivity type is n-type; and
the second conductivity type is p-type.

7. The semiconductor device of claim 1, wherein the JTE is a first JTE and the high carrier mobility region is a first high carrier mobility region, the termination region further including:
a second JTE of the second conductivity type disposed in the substrate adjacent to the first JTE, the second JTE including:
a third depletion stopper region disposed in an upper portion of the second JTE;
a fourth depletion stopper region disposed in a lower portion of the second JTE; and
a second high carrier mobility region disposed between the third depletion stopper region and the fourth depletion stopper region.

8. The semiconductor device of claim 7, wherein:
the first JTE extends from a surface of the substrate to a first depth in the substrate; and
the second JTE extends from the surface of the substrate to a second depth in the substrate, the second depth being less than the first depth.

9. The semiconductor device of claim 7, wherein the first high carrier mobility region and the second high carrier mobility region are aligned along a common longitudinal axis.

10. The semiconductor device of claim 7, wherein:
the first JTE includes a first dopant impurity dose; and
the second JTE includes a second dopant impurity dose, the second dopant impurity dose being less than the first dopant impurity dose.

11. The semiconductor device of claim 1, wherein the high carrier mobility region is a first high carrier mobility region, the termination region further including:
at least one floating ring of the second conductivity type disposed in the substrate and laterally spaced from the JTE, the JTE being disposed between the active region and the at least one floating ring,
a floating ring of the at least one floating ring having:
a third depletion stopper region disposed in an upper portion of the floating ring;
a fourth depletion stopper region disposed in a lower portion of the floating ring; and
a second high carrier mobility region disposed between the third depletion stopper region and the fourth depletion stopper region.

12. The semiconductor device of claim 11, wherein the first high carrier mobility region and the second high carrier mobility region are aligned along a common longitudinal axis.

13. The semiconductor device of claim 9, wherein:
the first JTE has a first width along the common longitudinal axis; and
the second JTE has a second width along the common longitudinal axis, the second width being less than the first width.

14. The semiconductor device of claim 1, wherein the active region includes at least one of:
a power diode; or
a power transistor.

15. A semiconductor device:
a substrate of a first conductivity type;
an active region disposed in the substrate, the active region including at least one active device; and
a termination region disposed in the substrate adjacent to the active region, the termination region excluding an active device, the termination region including a junction termination extension (JTE) of a second conductivity type, the second conductivity type being opposite the first conductivity type, the JTE having:
  a first depletion stopper region extending from a surface of the substrate to a first depth in the substrate;
  a high carrier mobility region extending from the first depth in the substrate to a second depth in the substrate, the second depth being greater than the first depth, the high carrier mobility region having a constant doping region extending over a range of depths between the first depth and the second depth; and
  a second depletion stopper region extending from the second depth in the substrate to a third depth in the substrate, the third depth being greater than the second depth,
  the high carrier mobility region having a carrier mobility that is greater than respective carrier mobilities of the first depletion stopper region and the second depletion stopper region.

16. The semiconductor device of claim 15, wherein:
the first depletion stopper region includes a first amount of dopant of the second conductivity type;
the high carrier mobility region includes a second amount of dopant of the second conductivity type, the second amount of dopant being less than the first amount of dopant; and
the second depletion stopper region includes a third amount of dopant of the second conductivity type, the third amount of dopant being greater than the second amount of dopant.

17. The semiconductor device of claim 15, wherein a difference between the second depth and the first depth is:
greater than the first depth; and
greater than a difference between the third depth and the second depth.

18. A semiconductor device:
a substrate including:
  a heavily-doped n-type silicon carbide substrate; and
  a lightly-doped n-type silicon carbide epitaxial layer disposed on the heavily-doped n-type silicon carbide substrate;
an active region disposed in the lightly-doped n-type silicon carbide epitaxial layer, the active region including at least one of:
  a power diode; or
  a power n-channel metal-oxide semiconductor field-effect transistor (MOSFET); and
a termination region disposed in the lightly-doped n-type silicon carbide epitaxial layer adjacent to the active region, the termination region excluding an active device, the termination region including a p-type junction termination extension (JTE), the p-type JTE having:
  a first depletion stopper region extending from a surface of the substrate to a first depth in the substrate;
  a high carrier mobility region extending from the first depth in the substrate to a second depth in the substrate, the second depth being greater than the first depth, the high carrier mobility region having a constant doping region extending over a range of depths between the first depth and the second depth; and
  a second depletion stopper region extending from the second depth in the substrate to a third depth in the substrate, the third depth being greater than the second depth,
  the high carrier mobility region having a carrier mobility that is greater than respective carrier mobilities of the first depletion stopper region and the second depletion stopper region.

19. The semiconductor device of claim 18, wherein the p-type JTE at least partially surrounds the active region.

20. The semiconductor device of claim 18, wherein:
the first depletion stopper region includes a first amount of p-type dopant;
the high carrier mobility region includes a second amount of p-type dopant, the second amount of p-type dopant being at least one order of magnitude less than the first amount of p-type dopant; and
the second depletion stopper region includes a third amount of p-type dopant, the third amount of p-type dopant being at least one order of magnitude greater than the second amount of p-type dopant.

* * * * *